US006583430B1

(12) United States Patent
Muraki

(10) Patent No.: US 6,583,430 B1
(45) Date of Patent: Jun. 24, 2003

(54) ELECTRON BEAM EXPOSURE METHOD AND APPARATUS

(75) Inventor: Masato Muraki, Inagi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/359,370

(22) Filed: Jul. 23, 1999

(30) Foreign Application Priority Data

Jul. 28, 1998 (JP) .......................................... 10-212754

(51) Int. Cl.[7] .............................................. H01J 37/302
(52) U.S. Cl. .............................. 250/492.22; 250/491.1; 250/398; 356/401; 430/22; 430/296; 430/942
(58) Field of Search ....................... 250/492.22, 491.1, 250/398; 356/401; 430/22, 296, 942

(56) References Cited

U.S. PATENT DOCUMENTS

| | | | | |
|---|---|---|---|---|
| 5,607,801 A | * | 3/1997 | Nozue | 430/22 |
| 5,905,267 A | | 5/1999 | Muraki | 250/492.22 |
| 5,912,467 A | * | 6/1999 | Okino | 250/491.1 |
| 6,132,910 A | * | 10/2000 | Kojima | 430/22 |

FOREIGN PATENT DOCUMENTS

JP  10-22195  1/1998

* cited by examiner

Primary Examiner—Bruce Anderson
Assistant Examiner—Zia R. Hashmi
(74) Attorney, Agent, or Firm—Fitzpatrick, Cella, Harper & Scinto

(57) ABSTRACT

Some of a plurality of alignment marks formed in advance on a substrate are selected, and the positions of the selected alignment marks are detected in turn. The layout regularity of a plurality of patterns on the substrate is determined on the basis of the design coordinate values and actually measured values of the alignment marks. A pattern is written on the patterns by moving a stage relative to the electron beam on the basis of the layout regularity of the plurality of patterns. During writing, one of the selected alignment marks is irradiated with an electron beam, and electrons reflected by the alignment mark are detected, thereby detecting the mark position. Any difference between this actually measured value and the previous actually measured value is calculated, and the relative position between the electron beam and stage is corrected based on this difference.

19 Claims, 6 Drawing Sheets

ELECTRON BEAM EXPOSURE METHOD AND APPARATUS

BACKGROUND OF THE INVENTION

The present invention relates to an electron beam exposure method and apparatus and, more particularly, to an electron beam exposure method and apparatus which can overwrite a pattern on an already written pattern with high precision, and a device manufacturing method using the same.

In an electron beam exposure apparatus, the position stability of an electron beam is an important factor that determines its work precision. As factors that impair the position stability of an electron beam, charging of a contaminant such as a carbon compound that has become attached inside an electron optical system for imaging an electron beam, or an electron beam position variation arising from a thermal or mechanical deformation of a structure for supporting the electron optical system or a sample base are known. When the electron beam position has varied, the relationship between the writing coordinate position defined by the electron beam and the coordinate position defined by a pattern already written on a sample deviates before or after writing, or during writing, thus impairing the overwriting precision.

Conventionally, a variation of the writing coordinate position defined by the electron beam due to an electron beam position variation is corrected by the following method.

A reference mark is formed on a movable stage which carries a sample such as a wafer or the like. The stage is then moved on the basis of a coordinate system defined by the stage to locate a standard mark at the design standard irradiation position of an electron beam, and a mark coordinate position (X0, Y0) of the reference mark is obtained by the electron beam. Writing is temporarily stopped during writing, and the stage is moved again to locate the reference mark at the standard irradiation position of the electron beam. The coordinate position of the standard position is detected by the electron beam to obtain a mark coordinate position (X1, Y1) at that time. Any difference ($\Delta$X1, $\Delta$Y1) between the previous mark coordinate position (X0, Y0) and the current mark coordinate position (X1, Y1) is calculated to obtain the electron beam position variation. Then, the deflection position of the electron beam or stage position is corrected based on this difference ($\Delta$X1, $\Delta$Y1). The aforementioned operation is repeated until the end of writing.

However, upon correcting such electron beam position variation in the conventional method, if the number of reference marks is one, since stage movement from the wafer writing area to the reference mark is required, writing must be stopped for several tens of seconds. When a plurality of reference marks is formed on the stage or wafer, the stage movement time can be shortened. However, the positions of all these reference marks must be measured prior to writing, resulting an increase in measurement time. As a result, in either case, the throughput of the electron beam exposure apparatus lowers.

SUMMARY OF THE INVENTION

It is an object of the present invention to provide an excellent electron beam exposure method and apparatus, which can solve the aforementioned problems, and a device manufacturing method.

It is another object of the present invention to attain efficient exposure by determining the regularity of the pattern layout on a substrate using some of a plurality of reference marks (a predetermined number of reference marks), and controlling exposure based on the regularity.

It is still another object of the present invention to attain position correction during exposure writing using at least one of the predetermined number reference marks used in determination of the regularity.

It is still another object of the present invention to attain position correction during exposure writing using a reference mark or marks which is or are not used in determination of the regularity.

In order to achieve the above objects, according one aspect of the present invention, an electron beam exposure method, which applies a photosensitive material to a substrate, on which a plurality of patterns and alignment marks associated with the plurality of patterns are formed to regularly line up along a design layout coordinate system, and overwrites a pattern on the respective patterns by moving a stage that carries the substrate relative to an electron beam, comprises: the first detection step of selecting some of the plurality of alignment marks, and sequentially detecting the positions of the selected alignment marks; the step of determining regularity of a layout of the plurality of patterns on the substrate on the basis of design coordinate values and actually measured values of the alignment marks in the first detection step; the step of writing a pattern on the respective patterns by moving the stage relative to the electron beam on the basis of the regularity of the layout of the plurality of patterns; the second detection step of detecting positions of the selected alignment marks by irradiating the selected alignment marks with the electron beam and detecting electrons reflected by the alignment marks; and the step of calculating the difference between actually measured values of the alignment marks in the second detection step, and the actually measured values of the alignment marks in the first detection step, and correcting a relative position between the electron beam and stage on the basis of the difference.

According to another aspect of the present invention, an electron beam exposure method, which applies a photosensitive material to a substrate, on which a plurality of patterns and alignment marks associated with the plurality of patterns are formed to regularly line up along a design layout coordinate system, and overwrites a pattern on the respective patterns by moving a stage that carries the substrate relative to an electron beam, comprises: the first detection step of selecting some of the plurality of alignment marks, and sequentially detecting the positions of the selected alignment marks; the step of determining regularity of a layout of the plurality of patterns on the substrate on the basis of design coordinate values and actually measured values of the alignment marks in the first detection step; the step of writing a pattern on the respective patterns by moving the stage relative to the electron beam on the basis of the regularity of the layout of the plurality of patterns; the second detection step of detecting positions of the selected alignment marks by irradiating the alignment marks with the electron beam and detecting electrons reflected by the alignment marks; and the step of calculating the difference between actually measured values of the alignment marks in the second detection step, and coordinate values of the alignment marks which are calculated from the regularity of the layout, and correcting a relative position between the electron beam and stage on the basis of the difference.

According to still another aspect of the present invention, there is provided an electron beam exposure apparatus, which applies a photosensitive material to a substrate, on which a plurality of patterns and alignment marks associated with the plurality of patterns are formed to regularly line up along a design layout coordinate system, and overwrites a pattern on the respective patterns by an electron beam, comprising: deflection means for deflecting the electron beam on the substrate; a stage which moves while carrying the substrate; a distance measurement system for detecting a position of the stage; a first detection system for detecting a position relative to an object to be detected on the stage, and detecting the position of the object to be detected in cooperation with the distance measurement system; a second detection system for irradiating the object to be irradiated with the electron beam on the stage with the electron beam, detecting electrons reflected by the object to be irradiated, and detecting the position of the object to be irradiated in cooperation with the distance measurement system; and control means for selecting some of the plurality of alignment marks, making the first detection system sequentially detect positions of the selected alignment marks, determining regularity of a layout of the plurality of patterns on the substrate on the basis of design coordinate values and actually measured values of the alignment marks by the first detection system, writing a pattern on the respective patterns by moving the substrate relative to the electron beam using the deflection means and stage on the basis of the regularity of the layout of the plurality of patterns, making the second detection system detect positions of the selected alignment marks during writing of the pattern on the substrate, calculating a difference between actually measured values of the selected alignment marks of the first and second detection systems, and correcting a relative position between the electron beam and the substrate using at least one of the deflection means and the stage on the basis of the calculated difference.

According to still another aspect of the present invention, there is provided an electron beam exposure apparatus, which applies a photosensitive material to a substrate, on which a plurality of patterns and alignment marks associated with the plurality of patterns are formed to regularly line up along a design layout coordinate system, and overwrites a pattern on the respective patterns by an electron beam, comprising: deflection means for deflecting the electron beam on the substrate; a stage which moves while carrying the substrate; a distance measurement system for detecting a position of the stage; a first detection system for detecting a position relative to an object to be detected on the stage, and detecting the position of the object to be detected in cooperation with the distance measurement system; a second detection system for irradiating the object to be irradiated with the electron beam on the stage with the electron beam, detecting electrons reflected by the object to be irradiated, and detecting the position of the object to be irradiated in cooperation with the distance measurement system; and control means for selecting some of the plurality of alignment marks, making the first detection system sequentially detect positions of the elected alignment marks, determining regularity of a layout of the plurality of patterns oh the substrate on the basis of design coordinate values and actually measured values of the alignment marks by the first detection system, writing a pattern on the respective patterns by moving the substrate relative to the electron beam using the deflection means and stage on the basis of the regularity of the layout of the plurality of patterns, making the second detection system detect positions of the selected alignment marks during writing of the pattern on the substrate, calculating a difference between actually measured values of the selected alignment marks and coordinate values of the selected alignment marks which are calculated based on the regularity of the layout, and correcting a relative position between the electron beam and the substrate using at least one of the deflection means and the stage on the basis of the calculated difference.

Furthermore, according to still another aspect of the present invention, there is provided a device manufacturing method that manufactures a device by manufacturing processes including one of the aforementioned electron beam exposure methods.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Arrangement of Electron Beam Exposure Apparatus

Figure 1:
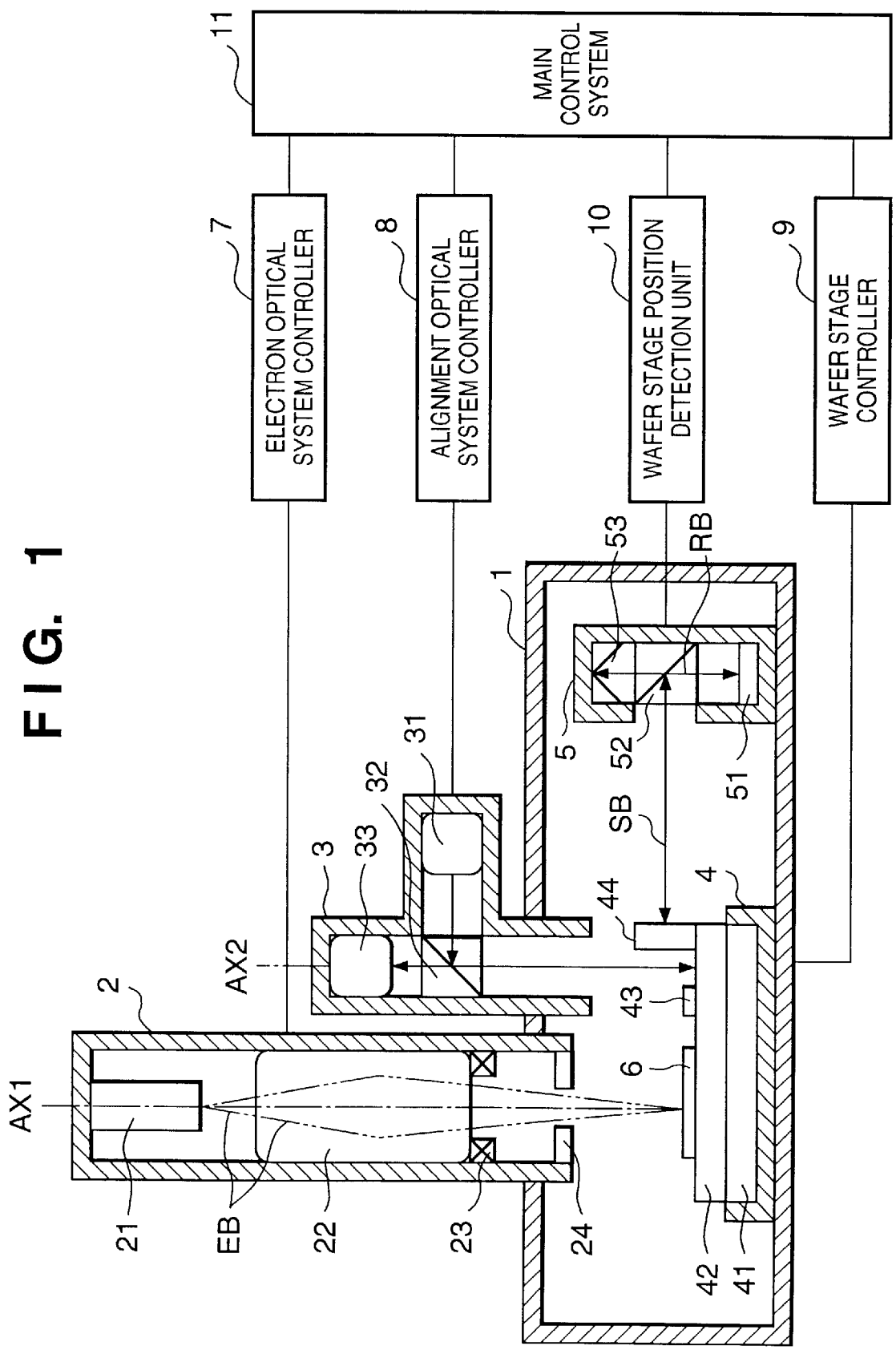
FIG. 1 is a diagram showing an electron beam exposure apparatus according to the present invention.

FIG. 1 shows an electron beam exposure apparatus according to an embodiment of the present invention. This apparatus mainly has a main structure 1, an electron optical system 2, an alignment optical system 3, a wafer stage 4, and an X-stage position distance measurement system 5. Structures that respectively hold the electron optical system 2, alignment optical system 3, wafer stage 4, and X-stage position distance measurement system 5 are held by the main structure 1.

The electron optical system 2 is built by an electron lens system 22 for converging an electron beam EB coming from an electron gun 21 that outputs an electron beam, a deflector 23 for deflecting the electron beam EB, and an electron detection system 24 for detecting electrons reflected by the object irradiated with the electron beam EB. The respective building components are controlled by an electron optical system controller 7. Upon exposing a wafer by the electron beam EB, the electron optical system controller makes the deflector 23 scan the electron beam EB, and controls irradiation of the electron beam EB in correspondence with each pattern to be written. Upon detecting the position of the object irradiated using the electron beam EB, the electron optical system controller 7 makes the deflector 23 scan the electron beam EB, and makes the electron detection system 24 detect electrons reflected by the object, thus detecting its position.

The alignment optical system 3 is constructed by an alignment light source 31 for outputting alignment light (having a wavelength that does not expose a photosensitive material applied to a wafer 6), a beam splitter 32 for directing light output from the alignment source 31 toward the object to be irradiated, and an image detector 33 for imaging light reflected by the object to be irradiated via the beam splitter 32, and detecting an image of the object to be irradiated. An alignment optical system controller 8 controls the respective building components, and detects the object position with respect to an optical axis AX2 of the alignment optical system.

The wafer stage 4 is constructed by placing an X-stage 42 on a Y-stage 41, and the wafer 6 applied with a photosensitive material is held on the X-stage 42. Furthermore, a reference plate 43 formed with a reference mark SM is placed at a position on the X-stage 42 different from that of the wafer 6, and an X-movable mirror 44 is placed at one end of the X-direction on the X-stage 42. The Y-stage 41 aligns the wafer 6 in the Y-direction perpendicular to the page of FIG. 1 in a lane perpendicular to an optical axis AX1 of the electron lens system 22, and the X-stage 42 aligns the wafer 6 in the X-direction perpendicular to the Y-axis in the plane perpendicular to the optical axis AX1 of the electron lens system 22. Note that a Z-stage and the like (not shown) for aligning the wafer in the Z-direction parallel to the optical axis AX1 of the electron optical system 22 are also placed on the X-stage 42. The Y-stage 41 and X-stage 42 are controlled by a wafer stage controller 9.

In the X-stage position distance measurement system 5, a laser beam emerging from an interferometer main body 51 is split by a beam splitter 52 into a distance measurement beam SB and reference beam RB. The distance measurement beam SB travels toward the X-movable mirror 44, is reflected by the mirror 44, and then returns to the beam splitter 52 again. The reference beam RB travels toward an X-reflecting prism 53, is reflected by the prism 53, and returns to the beam splitter 52 again. The two beams SB and RB which have returned to the beam splitter 52 enter a receiver included in the interferometer main body 51. Upon leaving the beam splitter 52, the distance measurement beam SB and reference beam RB have frequencies different by a small amount $\Delta f$, and the receiver outputs a beat signal whose frequency has changed from $\Delta f$ in correspondence with the moving speed of the X-movable mirror 44 in the X-direction. When this beat signal is processed by a wafer stage position detection unit 10, the change amount of the optical path length of the distance measurement beam RB with reference to the optical path length of the reference beam RB, i.e., the X-coordinate value of the X-movable mirror 44 with reference to the X-reflecting prism 23, can be measured with high resolution and precision. Also, the main structure 1 holds a Y-stage position distance measurement system (not shown), and a Y-movable mirror is provided to one end in the Y-direction on the X-stage 42. As in the X-direction, the Y-coordinate value of the Y-movable mirror with reference to a Y-reflecting prism in the Y-stage position distance measurement system can be measured with high resolution and precision.

A main control system 11 processes data output from the electron optical system controller 7, alignment optical system controller 8, wafer stage position detection unit 10, and wafer stage controller 9, and supplies commands and the like to these controllers.

Exposure Operation

The exposure operation of the electron beam exposure apparatus of this embodiment will be explained below with the aid of FIG. 3.

Figure 2:
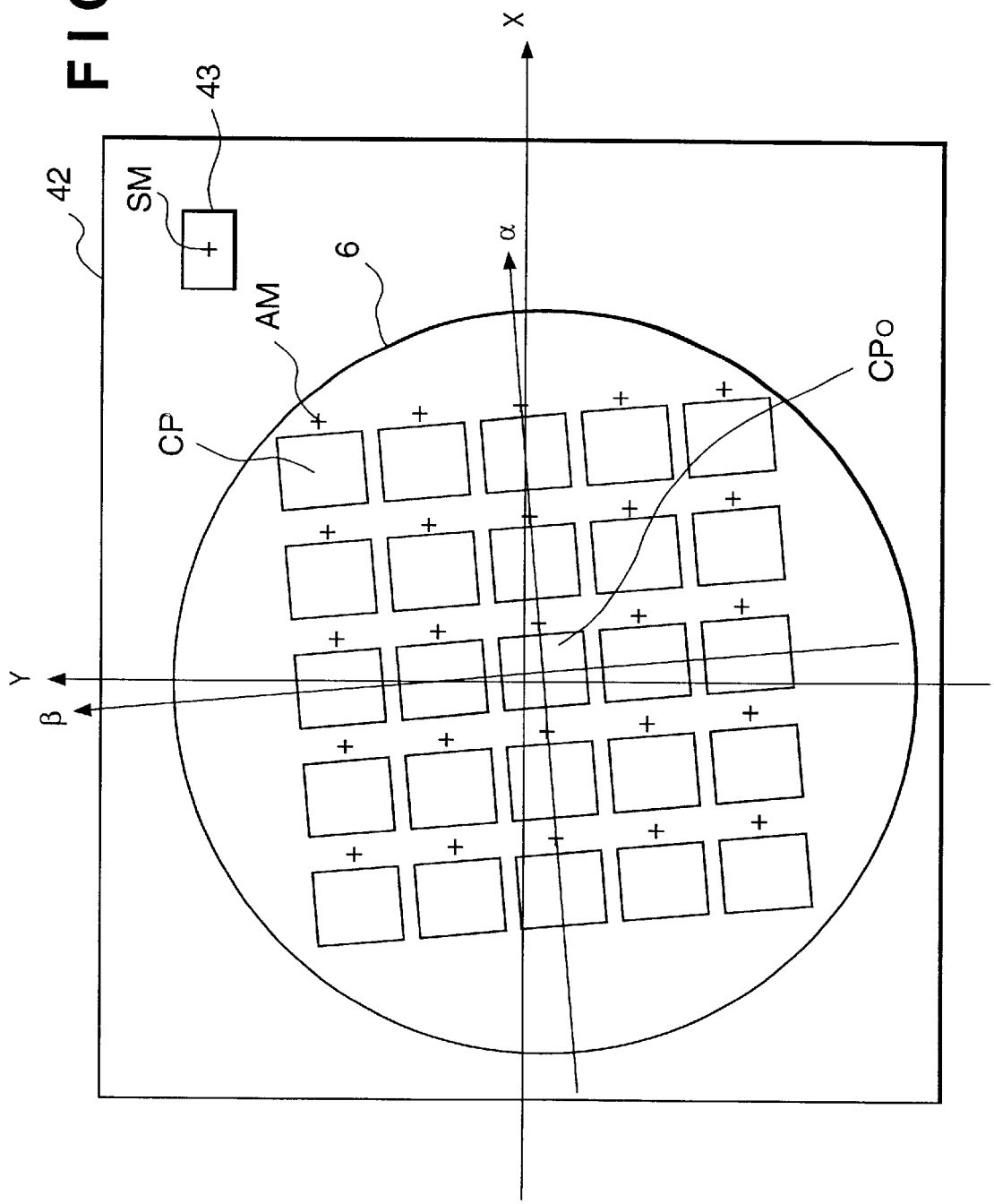
FIG. 2 is a view for explaining a layout coordinate system of pattern areas, and a stage coordinate system.

Prior to the description, a coordinate system will be explained. On the wafer 6 placed on the X-stage 42, a plurality of rectangular pattern areas CP are formed in a matrix along a layout coordinate system $\alpha\beta$, as shown in FIG. 2. Each pattern area CP is defined to overlap a pattern written by the electron beam, and X- and Y-alignment marks AM are formed in association with each pattern area CP. The origin of the layout coordinate $\alpha\beta$ is determined to match the central point of a pattern CP0, which is located near the center on the wafer 6. The design coordinate values (or X- and Y-stepping pitches) of each pattern area on the layout coordinate system $\alpha\beta$ are pre-stored in the main control system 11 shown in FIG. 1. The drive origin of the X-stage 42 (the origin of an X-stage coordinate system XY: the center of a position where the wafer 6 is held on the X-stage 42); note that the X- and Y-axes of the X-stage coordinate system XY represent the moving directions of the X-stage 42 (or coordinate measurement directions by the X-stage position distance measurement system) is determined by the wafer stage position detection unit 10 to match the center (optical axis AX2) of the alignment optical system 3.

Figure 3:
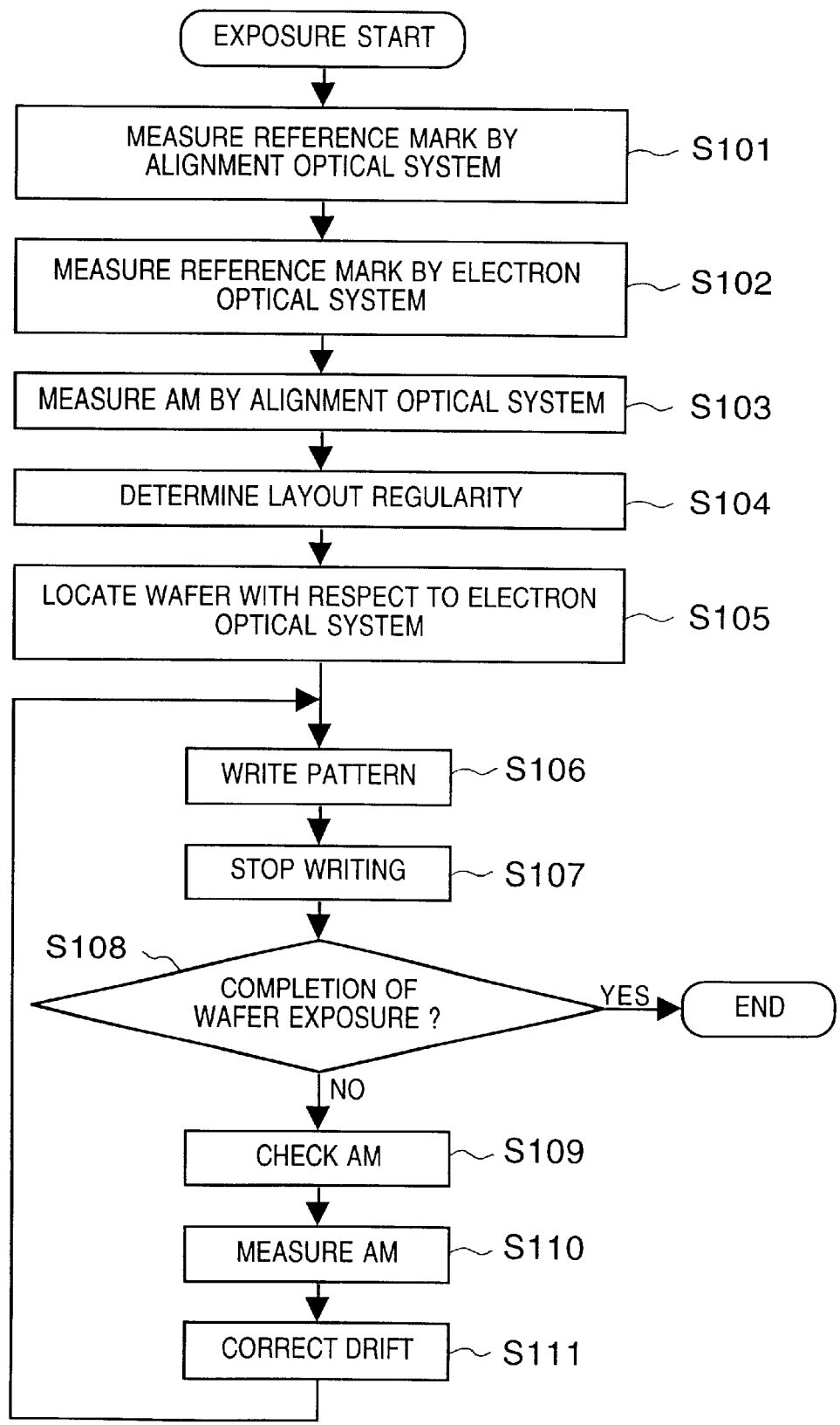
FIG. 3 is a flow chart for explaining the exposure flow according to the first embodiment of the present invention.

Upon starting exposure, the main control system 11 executes the following steps (see FIG. 3).

(Step S101)

The wafer stage 4 is moved to locate the reference mark SM on the optical axis AX2 of the alignment optical system 3 on the basis of the design coordinate position of the reference mark SM in the stage coordinate system (movement of the wafer stage 4 means movement of the wafer stage 4 in cooperation of the wafer stage controller 9 and wafer stage position detection unit 10, and the same applies to the following description). The alignment optical system controller 8 detects any position displacement of the reference mark SM from the optical axis AX, and re-sets the stage coordinate system defined by the wafer stage position detection unit 10 based on that position displacement, so that the origin of the stage coordinate system XY matches the optical axis AX2.

(Step S102)

The wafer stage 4 is moved to locate the reference mark SM on the optical axis AX1 of the electron optical system 3 on the basis of the design positional relationship between the optical axes AX1 and AX2 (a difference (XB, YB) between their coordinate positions). The electron optical system controller 7 scans the reference mask SM with the electron beam to detect any position displacement ($\Delta$XB, $\Delta$YB) of the reference mark SM from the optical axis AX2, thereby determining a baseline (XB–$\Delta$XB, YB–$\Delta$YB) between the optical axes AX1 and AX2.

(Step S103)

Some alignment marks on the wafer 6 are selected, and the alignment mark AM of each selected pattern area CP is moved to be located on the optical axis AX2 of the alignment optical system 3 on the basis of its design coordinate position. The alignment optical system controller 8 detects any position displacement of that alignment mark AM from the optical axis AX2. An actually measured value (XXi, YYi) of the position of that alignment mark AM is obtained based on the detected position displacement, and the design coordinate position (moving amount of the wafer stage 4) of the alignment mark AM.

(Step S104)

The layout regularity of the pattern areas CP on the wafer 6 is determined on the basis of the actually measured values (XXi, YYi) of the positions of the alignment marks AM. The determination method will be described in detail below.

As for the layout regularity of shots (pattern areas CP) on a single wafer, linear distortion on a plane is assumed, and the following six variables are introduced.

rx . . . linear expansion/contraction amount (scaling x) of wafer in x-direction ry . . . linear expansion/contraction amount (scaling y) of wafer in y-direction θ . . . rotation amount (rotation) of layout coordinate system αβ

ω . . . tilt amount (orthogonality) of coordinate system αβ

Ox . . . translation amount (shift x) of wafer in x-direction

Oy . . . translation amount (shift y) of wafer in y-direction

When these variables are assumed, a shot located at a design coordinate value (xi, yi) is mapped to a coordinate value (Xi, Yi) by:

$$\begin{pmatrix} Xi \\ Yi \end{pmatrix} = \begin{pmatrix} rx & 0 \\ 0 & ry \end{pmatrix} \begin{pmatrix} \cos\theta & -\sin\theta \\ \sin\theta & \cos\theta \end{pmatrix} \begin{pmatrix} 1 & -\tan\omega \\ 0 & 1 \end{pmatrix} \begin{pmatrix} xi \\ yi \end{pmatrix} + \begin{pmatrix} \overline{0}x \\ \overline{0}y \end{pmatrix} \quad (1)$$

Hence, if the six variables are obtained, an actual position (Xi, Yi) of each shot with respect to its design position (xi, yi) can be uniquely determined.

Assume that the rotation θ and orthogonality ω are very small, and the above variables are summarized to the following six variables A, B, C, D, E, and F:

A=rx·cos θ≈rx

B=−rx(cos θ tan ω+sin θ)≈−rs(ω+θ)

C=ry·sin θ≈ry·θ

D=ry(−sin θ tan ω+cos θ)≈ry

E=Ox

F=Oy equation (1) is rewritten as:

$$\begin{pmatrix} Xi \\ Yi \end{pmatrix} = \begin{pmatrix} A & B \\ C & D \end{pmatrix} \begin{pmatrix} xi \\ yi \end{pmatrix} + \begin{pmatrix} E \\ F \end{pmatrix} \quad (2)$$

Since there are six unknowns A, B, C, D, E, and F in equation (2), if there are six equations, i.e., at least three shots (two positions, i.e., x- and y-positions per shot) are selected, the solution of equation (2) can be uniquely determined.

However, a model on the actual wafer has a residual term (∈xi, ∈yi) with respect to the design value (xi, yi) and actually measured value (XXi, YYi), and the mapping relationship given by equation (3) below holds:

$$\begin{pmatrix} XXi \\ YYi \end{pmatrix} = \begin{pmatrix} A & B \\ C & D \end{pmatrix} \begin{pmatrix} xi \\ yi \end{pmatrix} + \begin{pmatrix} E \\ F \end{pmatrix} + \begin{pmatrix} \varepsilon xi \\ \varepsilon yi \end{pmatrix} \quad (3)$$

Hence, A, B, C, D, E, and F that minimize square sums $\Sigma \in xi^2$ and $\Sigma \in yi^2$ are calculated. If the method of least squares is used, the x-component in equation (3) is given by:

$$XXi = A \cdot xi + B \cdot yi + E + \in xi \quad (4)$$

If k represents the number of shots that undergo sample alignment, the square sum $\Sigma \in xi^2$ is given by:

$$\sum_{i=1}^{k} \varepsilon xi^2 = \sum_{i=1}^{k} (XXi - A \cdot xi - B \cdot yi - E)^2 \quad (5)$$

In order to obtain A, B, and E that minimize equation (5), equation (5) is partially differentiated for unknowns A, B, and E, and the respective partial differential formulas are equated to zero. The obtained three formulas are rewritten into the form of a matrix:

$$\begin{pmatrix} \sum xi^2 & \sum xi \cdot yi & \sum xi \\ \sum xi \cdot yi & \sum yi^2 & \sum yi \\ \sum xi & \sum yi & \sum 1 \end{pmatrix} \begin{pmatrix} A \\ B \\ C \end{pmatrix} = \begin{pmatrix} \sum XXi \cdot xi \\ \sum XXi \cdot yi \\ \sum XXi \end{pmatrix} \quad (6)$$

The y-component in equation (3) is similarly given by:

$$\begin{pmatrix} \sum xi^2 & \sum xi \cdot yi & \sum xi \\ \sum xi \cdot yi & \sum yi^2 & \sum yi \\ \sum xi & \sum yi & \sum 1 \end{pmatrix} \begin{pmatrix} C \\ D \\ F \end{pmatrix} = \begin{pmatrix} \sum YYi \cdot xi \\ \sum YYi \cdot yi \\ \sum YYi \end{pmatrix} \quad (7)$$

More specifically, upon completion of measurement of each shot, Σxi, Σyi, Σxi², Σyi², Σxi·yi, ΣXXi·xi, ΣXXi·yi, ΣXXi, ΣYYi·xi, ΣYYi·yi, ΣYYi, and the like are respectively summed up. When equations (6) and (7) are solved upon completion of measurement of the k-th shot (k is smaller than the number of shots on the wafer), all the unknowns A, B, C, D, E, and F can be obtained. After A, B, C, D, E, and F are obtained, the layout regularity of the pattern area CP can be determined by substitution of these unknowns into equation (2).

(Step S105)

The central point (the origin of the layout coordinate system αβ) of the pattern area CP0 is moved to a predetermined position with respect to the optical axis AX1 on the basis of the baseline determined in step S102.

(Step S106)

An actual position (Xi, Yi) in each pattern area with respect to its design position (xi, yi) is calculated on the basis of the determined layout regularity, and at least one of the deflector 23 and wafer stage 4 is operated to align the electron beam EB to this actual position (Xi, Yi), thus writing a pattern corresponding to the design value (xi, yi) of the pattern area CP.

(Step S107)

If the writing time in step S106 has exceeded a predetermined time, writing is stopped.

(Step S108)

If all the areas to be written on the wafer 6 have been written, exposure of the wafer is completed.

(Step S109)

The alignment mark AM closest to the current irradiation position of the electron beam is checked. In this case, the position of that alignment mark need not be actually measured upon determining the layout regularity.

(Step S110)

An actual position (Xi, Yi) of the alignment mark AM closest to the current irradiation position of the electron beam with respect to its design position (xi, yi) is calculated on the basis of the determined layout regularity, and the wafer stage 4 is moved to locate the actual position (Xi, Yi) on the optical axis Ax1 of the electron optical system 2. The electron optical system controller 8 scans the alignment mark AM with the electron beam to detect a position displacement (ΔXE, ΔYE) of the alignment mark AM with respect to the optical axis AX2.

(Step S111)

The position displacement (ΔXE, ΔYE) is considered as an electron beam position variation value (drift value) during writing, and the deflection position of the electron beam or wafer stage position is corrected on the basis of the position displacement (ΔXE, ΔYE). The flow then returns to step S106.

Another Embodiment

In the above embodiment, the alignment mark position is detected by non-exposure light to determine the layout regularity. This is to use an identical alignment mark when the exposed wafer is developed, is etched, undergoes film formation, and is exposed again. (Of course, the alignment mark whose position is detected by the electron beam is destroyed by passing a development process, etching process or film-forming process after an exposure process, but the number of exposed alignment marks can be minimized since other alignment marks can be used.)

In this embodiment, an identical alignment mark is not used upon re-exposure, and the alignment mark position is detected by the electron optical system 2 in place of the alignment optical system 3. Hence, the difference in arrangement from the first embodiment lies in that the need for the alignment optical system 3 and alignment optical system controller 8 in FIG. 1 can be obviated, and illustration of the arrangement will be omitted.

Figure 4:
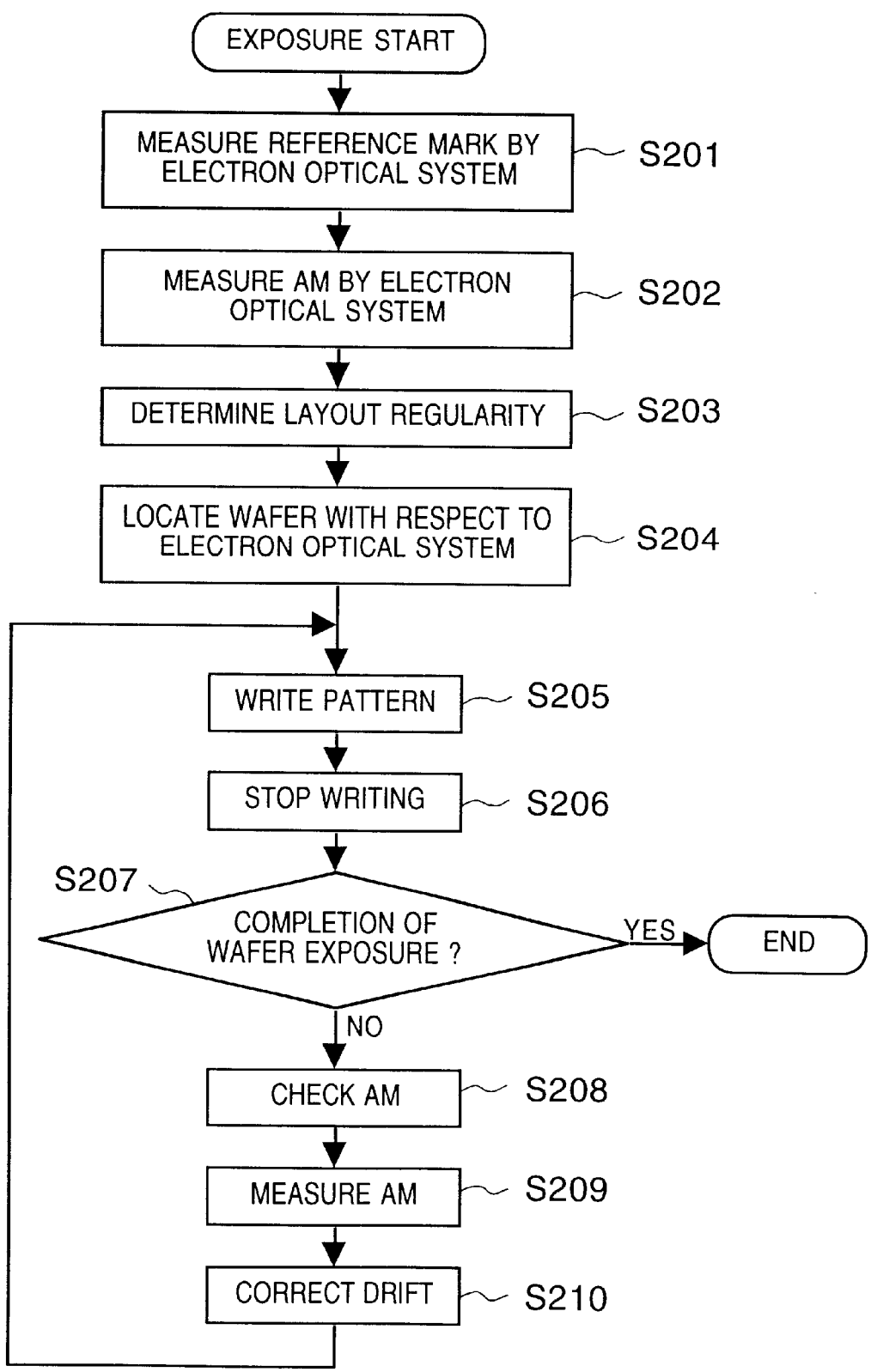
FIG. 4 is a flow chart for explaining the exposure flow according to the second embodiment of the present invention.

The exposure operation of the electron beam exposure apparatus of this embodiment will be described below with reference to FIG. 4.

In this embodiment, the origin of the stage coordinate system XY (on the X stage 42 and the center of a portion where the wafer 6 is held) is determined in advance by the wafer stage position detection unit 10 to match the center (optical axis AX2) of the detection field of the electron optical system 2.

Upon starting exposure, the main control system 11 executes the following steps.

(Step S201)

The wafer stage 4 is moved to locate the reference mark SM on the optical axis AX2 of the alignment optical system 3 on the basis of the design coordinate position of the reference mark SM in the stage coordinate system (movement of the wafer stage 4 means movement of the wafer stage 4 in cooperation with the wafer stage controller 9 and wafer stage position detection unit 10, and the same applies to the following description). The electron optical system controller 7 detects any position displacement of the reference mark SM from the optical axis AX1, and re-sets the stage coordinate system defined by the wafer stage position detection unit 10 based on that position displacement, so that the origin of the stage coordinate system XY matches the optical axis AX2.

(Step S202)

Some alignment marks on the wafer 6 are selected, and the alignment mark AM of each selected pattern area CP is moved to be located on the optical axis AX1 of the electron optical system 2 on the basis of its design coordinate position. The electron optical system controller 7 detects any position displacement of that alignment mark AM from the optical axis AX1. An actually measured value (XXi, YYi) of the position of that alignment mark AM is obtained based on the detected position displacement, and the design coordinate position (moving amount of the wafer stage 4) of the alignment mark AM.

(Step S203)

The layout regularity of the pattern areas CP on the wafer 6 is determined on the basis of the actually measured values (XXi, YYi) of the positions of the alignment marks AM. Since the determination method is the same as that in step S104 in the first embodiment, a detailed description thereof will be omitted.

(Step S204)

The central point (the origin of the layout coordinate system αβ) of the pattern area CP0 is moved to a predetermined position with respect to the optical axis AX1.

(Step S205)

An actual position (Xi, Yi) in each pattern area with respect to its design position (xi, yi) is calculated on the basis of the determined layout regularity, and at least one of the deflector 23 and wafer stage 4 is operated to align the electron beam EB to this actual position (Xi, Yi), thus writing a pattern corresponding to the design value (xi, yi) of the pattern area CP.

(Step S206)

If the writing time in step S205 has exceeded a predetermined time, writing is stopped.

(Step S207)

If all the areas to be written on the wafer 6 have been written, exposure of the wafer is completed.

(Step S208)

The alignment mark AM closest to the current irradiation position of the electron beam is checked. In this case, the position of that alignment mark need not be actually measured upon determining the layout regularity.

(Step S209)

An actual position (Xi, Yi) of the alignment mark AM closest to the current irradiation position of the electron beam with respect to its design position (xi, yi) is calculated on the basis of the determined layout regularity, and the wafer stage 4 is moved to locate the actual position (Xi, Yi) on the optical axis AX1 of the electron optical system 2. The electron optical system controller 8 scans the alignment mark AM with the electron beam to detect a position displacement ($\Delta$XE, $\Delta$YE) of the alignment mark AM with respect to the optical axis AX2.

(Step S210)

The position displacement ($\Delta$XE, $\Delta$YE) is considered as an electron beam position variation value (drift value) during writing, and the deflection position of the electron beam or wafer stage position is corrected on the basis of the position displacement ($\Delta$XE, $\Delta$YE). The flow then returns to step S205.

In either embodiment described above, the position of the alignment mark AM closest to the current irradiation position of the electron beam is detected to detect the electron beam position variation value. Alternatively, the position of the alignment mark, which is closest to the current irradiation position of the electron beam, and has been actually measured to determine the layout regularity (e.g., the alignment mark whose position has been actually measured in step S103 or S202), may be detected to obtain the electron beam position variation value.

Device Manufacturing Method

An embodiment of the device manufacturing method using the aforementioned electron beam exposure apparatus will be explained below.

Figure 5:
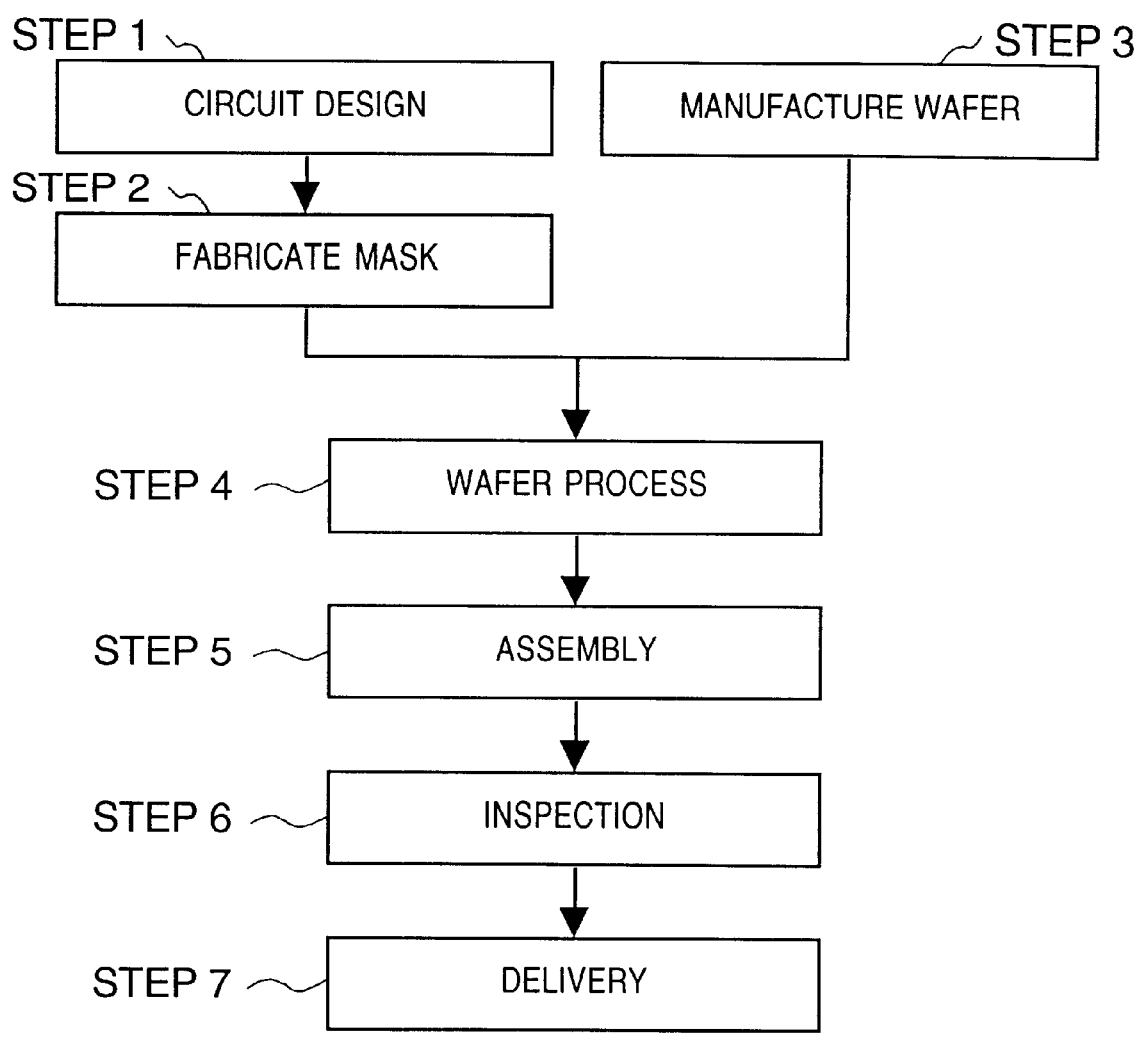
FIG. 5 is a flow chart for explaining the flow for manufacturing a microdevice.

FIG. 5 shows the flow in the manufacture of a microdevice (e.g., semiconductor chips such as LSIs, ICs, or the like, liquid crystal panels, CCDs, thin film magnetic heads, micromachines, and the like). In step 1 (circuit design), the circuit design of a semiconductor device is made. In step 2 (preparation of exposure control data), exposure control data are prepared based on the circuit design. In step 3 (fabricate wafer), a wafer is fabricated using materials such as silicon and the like. Step 4 (wafer process) is called a pre-process, and an actual circuit is formed by lithography using an exposure apparatus with exposure control data, and a wafer. The next step, step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 6:
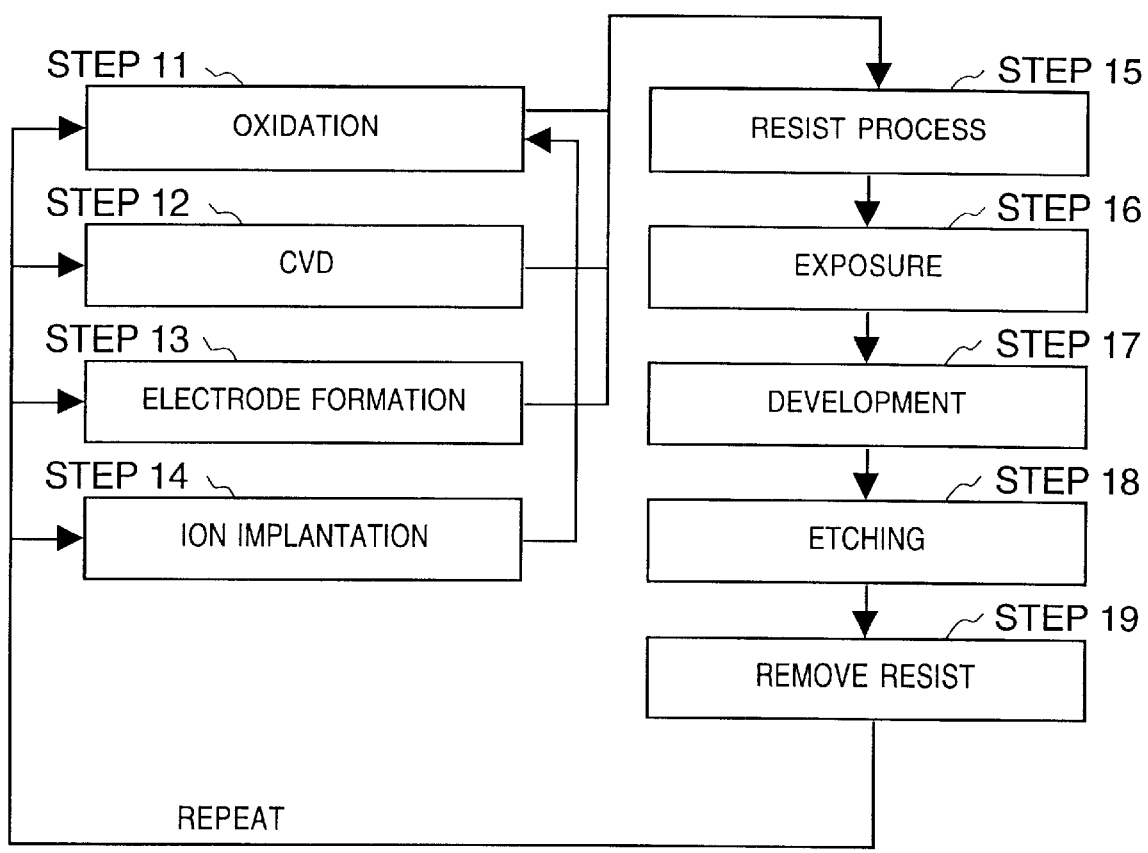
FIG. 6 is a flow chart for explaining the wafer process.

FIG. 6 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19 (remove resist), the resist film which has become unnecessary after etching is removed. By repeating these steps, multiple circuit patterns are formed on the wafer.

Using the manufacturing method of this embodiment, highly integrated semiconductor devices, which are hard to manufacture by the conventional method, can be manufactured with low cost.

According to the present invention, since the electron beam position variation value is detected using the alignment mark, which is also used upon determining the layout regularity of patterns on the wafer, the time required for correcting position variation of the electron beam can be shortened. Furthermore, by exploiting that regularity, since any position variation of the electron beam can be corrected using an arbitrary alignment mark, whose position is not actually measured, stage movement upon correction can be minimized, and the frequency of correction can be increased compared to the conventional method. Hence, the throughput and overwriting precision of the electron beam exposure apparatus can be improved. When a device is manufactured using such method, a device with higher precision than the conventional one can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. An electron beam exposure method for writing, using an electron beam, an image on a substrate on which a plurality of patterns, and alignment marks associated with the plurality of patterns are formed comprising:

the first detection step of selecting some of the plurality of alignment marks, and detecting positions of the selected alignment marks;

the determination step of determining layout regularity of the plurality of patterns on the basis of the measured values in the first detection step;

the writing step of writing a pattern on the plurality of patterns by moving the substrate relative to the electron beam on the basis of the regularity determined in the determination step;

the second detection step of detecting a position of at least one of the alignment marks, by using the electron beam, selected in the first detection step; and the correction step of correcting a position variation of the electron beam on the basis of the position of the alignment mark detected in the second detection step, and the position of that alignment mark detected in the first detection step.

2. The method according to claim 1, wherein the second detection step includes the step of detecting the position of the alignment mark, which is closest to an irradiation position of the electron beam, of the alignment marks selected in the first detection step when the second detection step is executed.

3. The method according to claim 1, wherein the first detection step includes the step of detecting the position of the alignment mark by irradiating the alignment mark with the electron beam and detecting electrons reflected by the alignment mark.

4. An electron beam exposure method for writing, using an electron beam, an image on a substrate on which a plurality of patterns, and alignment marks associated with the plurality of patterns are formed, comprising:

the first detection step of selecting some of the plurality of alignment marks, and detecting positions of the selected alignment marks;

the determination step of determining layout regularity of the plurality of patterns on the basis of the measured values in the first detection step;

the writing step of writing a pattern on the plurality of patterns by moving the substrate relative to the electron beam on the basis of the regularity determined in the determination step;

the second detection step of detecting a position of at least one of alignment marks, by using the electron beam, other than the alignment marks selected in the first detection step; and the correction step of correcting a position variation of the electron beam on the basis of the position of the alignment mark detected in the second detection step, and the position of that alignment mark obtained on the basis of the regularity determined in the determination step.

5. The method according to claim 4, wherein the second detection step includes the step of detecting the position of the alignment mark, which is closest to an irradiation position of the electron beam, of the alignment marks other than the alignment marks selected in the first detection step when the second detection step is executed.

6. The method according to claim 4, wherein the first detection step includes the step of detecting the position of the alignment mark by irradiating the alignment mark with the electron beam and detecting electrons reflected by the alignment mark.

7. The method according to claim 1, wherein the first detection step includes the step of detecting the positions of the alignment marks by irradiating the alignment marks with a light coming from an optical detecting system.

8. The method according to claim 7, further comprising:

the step of detecting a position of a standard mark formed at a position, different from the substrate, on a stage which carries the substrate, by the optical detection system, prior to writing on the substrate, detecting the position of the standard mark by irradiating the standard mark with the electron beam, and correcting a baseline on the basis of a measured value by the optical detection system, which pertains to the position of the standard mark, and a measured value by the electron beam.

9. An electron beam exposure apparatus for writing an image by moving a stage relative to an electron beam, the stage carrying a substrate on which a plurality of patterns, and alignment marks associated with the plurality of patterns are formed, comprising:

first detection means for selecting some of the plurality of alignment marks, and detecting positions of the selected alignment marks;

determination means for determining layout regularity of the plurality of patterns on the basis of the measured values of said first detection means; and writing means for writing a pattern on the plurality of patterns by moving the substrate relative to the electron beam on the basis of the regularity determined by said determination means;

second detection means for detecting a position of at least one of the alignment marks, by using the electron beam, selected by said first detection means; and correction means for correcting a position variation of the electron beam on the basis of the position of the alignment mark detected by said second detection means, and the position of that alignment mark detected by said first detection means.

10. The apparatus according to claim 9, wherein said second detection detects the position of the alignment mark, which is closest to an irradiation position of the electron beam, of the alignment marks selected by said first detection means when said second detection means is executed.

11. The apparatus according to claim 9, wherein said first detection means detects the position of the alignment mark by irradiating the alignment mark with the electron beam and detecting electrons reflected by the alignment mark.

12. An electron beam exposure apparatus for writing an image by moving a stage relative to an electron beam, the stage carrying a substrate on which a plurality of patterns, and alignment marks associated with the plurality of patterns are formed, comprising:

first detection means for selecting some of the plurality of alignment marks, and detecting positions of the selected alignment marks;

determination means for determining layout regularity of the plurality of patterns on the basis of the measured values of said first detection means;

writing means for writing a pattern on the plurality of patterns by moving the substrate relative to the electron beam on the basis of the regularity determined by said determination means;

second detection means for detecting a position of at least one of alignment marks, by using the electron beam, other than the alignment marks selected by said first detection means; and correction means for correcting a position variation of the electron beam on the basis of the position of the alignment mark detected by said second detection means, and the position of that alignment mark obtained on the basis of the regularity determined by said determination means.

13. The apparatus according to claim 12, wherein said second detection means detects the position of the alignment mark, which is closest to an irradiation position of the electron beam, of the alignment marks other than the alignment marks selected by said first detection means when said second detection means is executed.

14. The apparatus according to claim 12, wherein said first detection means detects the position of the alignment mark by irradiating the alignment mark with the electron beam and detecting electrons reflected by the alignment mark.

15. The apparatus according to claim 9, wherein said first detection means detects the positions of the alignment marks by irradiating the alignment marks with a light coming from an optical detection system.

16. The apparatus according to claim 15, further comprising:

means for detecting a position of a standard mark formed at a position, different from the substrate, on a stage which carries the substrate, by the optical detection system, prior to writing on the substrate, detecting the position of the standard mark by irradiating the standard mark with the electron beam, and correcting a baseline on the basis of a measured value by the optical detection system, which pertains to the position of the standard mark, and a measured value by the electron beam.

17. A device manufacturing method for manufacturing a device by a manufacturing process including an electron beam exposure method of claim 1.

18. A method according to claim 4, wherein the first detection step includes the step of detecting the positions of the alignment marks with a light coming from an optical detection system.

19. The method according to claim 18, further comprising:

the step of detecting a position of a standard mark formed at a position different from the substrate, on a stage which carries the substrate, by the optical detection system, prior to writing on the substrate, detecting the position of the standard mark by irradiating the standard mark with the electron beam, and correcting a baseline on the basis of a measured value by the optical detection system, which pertains to the position of the standard mark, and a measured value by the electron beam.

* * * * *